United States Patent [19]
Gerber et al.

[11] Patent Number: 6,020,634
[45] Date of Patent: *Feb. 1, 2000

[54] REPLACEABLE POWER MODULE

[75] Inventors: Mark A. Gerber, Plano; Michael K. Strittmatter, Carrollton; Neil McLellan, Garland; Joseph P. Hundt, Corinth, all of Tex.

[73] Assignee: Dallas Semiconductor Corporation, Dallas, Tex.

[*] Notice: This patent is subject to a terminal disclaimer.

[21] Appl. No.: 09/135,197

[22] Filed: Aug. 17, 1998

Related U.S. Application Data

[63] Continuation of application No. 08/568,854, Dec. 7, 1995, Pat. No. 5,821,619.

[51] Int. Cl.[7] .................................................. H01L 23/34
[52] U.S. Cl. ........................ 257/726; 257/686; 257/730; 257/924
[58] Field of Search .................................. 257/924, 528, 257/730, 726, 720, 686

[56] References Cited

U.S. PATENT DOCUMENTS

| | | | |
|---|---|---|---|
| 5,289,034 | 2/1994 | Hundt | 257/924 |
| 5,376,825 | 12/1994 | Tukamoto et al. | 257/685 |
| 5,557,504 | 9/1996 | Siegel et al. | 257/666 |

*Primary Examiner*—Carl Whitehead, Jr.
*Assistant Examiner*—Roy Potter
*Attorney, Agent, or Firm*—Jenkens & Gilchrist P.C.

[57] ABSTRACT

The replaceable power module includes a power section positioned between a cover and a frame. The cover is provided with clips to permit the attachment and detachment of the cover to the base as well the attachment and detachment of the power module to a surface mounted integrated circuit. The frame is provided with an opening for receiving the integrated circuit, and electrical contacts for electrically connecting the power module to the leads of an integrated circuit. The power section is electrically coupled to the frame and includes a battery and a crystal oscillator for controlling the integrated circuit.

20 Claims, 3 Drawing Sheets

REPLACEABLE POWER MODULE

This application is a continuation of application Ser. No. 08/568,854, filed Dec. 7, 1995 now U.S. Pat. No. 5,821,619.

TECHNICAL FIELD OF THE INVENTION

The present invention relates structures than can be connected to integrated circuits to enhance the capabilities and functions thereof and, in particular, to a replaceable power module for a nonvolatile real time clock or a nonvolatile static RAM.

BACKGROUND OF THE INVENTION

The market for surface mounted Nonvolatile Real Time Clock (NRTC) devices, Nonvolatile Static RAM (NVSRAM) devices, and other lithium battery backed integrated circuits has been limited due to the physical characteristics of the battery and the crystal oscillator as well as the physical characteristics of the devices themselves.

Many current NRTC and NVSRAM devices consist of a large encapsulated part utilizing a package that must be installed by hand or wave soldering, or through the use of a special socket. However, because batteries and crystal oscillators are temperature sensitive, these devices cannot be surface mounted using reflow surface mounting techniques. Reflow surface mounting requires that the device be subjected to high temperatures (approximately 215° C.) for proper attachment. These high temperatures damage the temperature sensitive batteries and crystals.

An additional problem with this technology occurs when the batteries of the devices are exhausted. When this occurs, the entire device must be removed and replaced with an new device. This creates higher costs to the user.

Because of these problems as well as the large size of the encapsulated parts, many electronic devices such as the laptop personal computer and other small scale computers have to be manufactured without these types of NRTC or NVSRAM packages.

Currently, the single chip surface mountable plastic leaded chip carrier (PLCC), small outline integrated circuit (SOIC), thin small outline package (TSOP), and small outline J-lead (SOJ) versions of the NRTC and NVSRAM are sold to electronic manufacturers without a battery or a crystal oscillator. It is the manufacturer who is required to mount a battery and a crystal oscillator on the printed circuit board after the device has been surface mounted.

A major problem with this configuration also occurs when a problem with the battery or the crystal oscillator arises or when the product has completed its useful life. When these situations occur the old battery and crystal oscillator have to be un-soldered prior to the installation of a replacement battery and crystal. This process is very timely and ultimately leads to higher manufacturing cost.

One device manufacture, SGS Thompson, has made a device having a battery and crystal package attachable to a modified SOIC device. The battery and crystal package has contact pins which extend from the package and are inserted into matching female receptacles in the modified SOIC device. The battery and crystal package is designed to be attached to the modified SOIC device after the device has been surface mounted.

While the SGS Thompson's device does have some advantages over the current DIP lead technology, the height of the device is still too large for many applications. Because of the need for female receptacles in the SOIC device, the device must be modified or custom made to accommodate for the contact pins of the battery and crystal package. Therefore, the SGS devices are not compatible with market standard packages such as the TSOP, PLCC, SOIC, and SOJ packages.

An additional problem with the SGS device is that cleaning materials used to clean surface mounted devices tend to get trapped in the female receptacles. Also, prior to the attachment of the battery and crystal package, the exposed contract pins of the package are highly susceptible to shorting during handling.

Currently there also is a Low Profile Module (LPM) for NVSRAMs, which, like the SGS device, has some advantages over the DIP lead technology. However, the LPM requires the user to provide an additional socket which must be surface mounted prior to the installation of the LPM. Further, the socket and LPM device have a larger area and larger height associated with it due to the addition of the socket.

SUMMARY OF THE INVENTION

The present invention overcomes the shortcomings and deficiencies of the existing technologies by providing a replaceable power module having a battery and a crystal oscillator that can be readily attached to existing NRTC and NVSRAM devices utilizing standard TSOP, SOIC, PLCC and SOJ type packages.

Accordingly, it is an object of the present is invention to provide a replaceable power module that can be readily attached and removed from existing surface mounted NRTC and NVSRAM devices utilizing market standard packages such as TSOP, SOIC, PLCC, and SOJ type packages.

It is a further object of the present invention to provide a replaceable power module such that when attached to market standard NRTC or NVSRAM devices, the resulting size of the device is smaller in area and height than existing devices.

It is yet another object of the present invention to provide a replaceable power module having pressure contacts or mechanical clips so that the module can be easily mounted onto a surface mounted NRTC or NVSRAM device.

It is still another object of the present invention to provide a replaceable power module which is not prone to shorting prior to assembly with an NRTC or NVSRAM device.

It is a further object of the present invention to provide a replaceable power module which is compatible with surface mount and surface mount cleaning technologies.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION OF THE PRESENTLY PREFERRED EXEMPLARY EMBODIMENT

Figure 1:
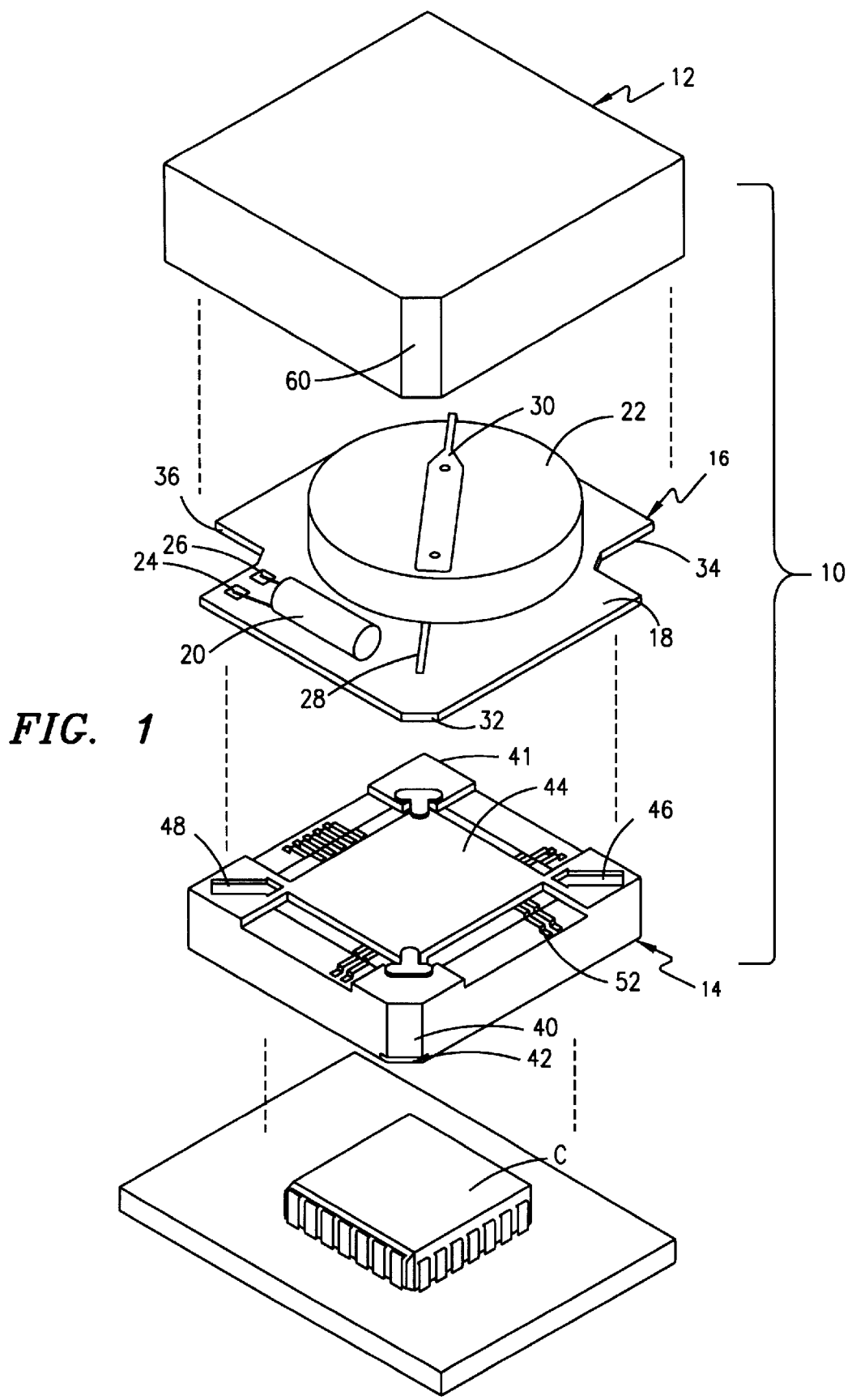
FIG. 1 is an exploded perspective view illustrating the main components of a preferred embodiment of the present invention.

Referring now to the drawings wherein like or similar elements are designated with identical reference numerals throughout the several views, and wherein the various elements depicted are not necessarily drawn to scale, and in particular, to FIG. 1, there is shown a preferred embodiment of the present invention in the form of a replaceable power module 10.

Power module 10 includes three major components; a cover 12, a base or frame 14, and an intermediate or power section 16.

Power section 16 includes a printed circuit board 18, a crystal oscillator 20, and a battery 22. Crystal oscillator 20 is physically and electrically coupled to printed circuit board 18 by electrical contacts 24 and 26, while battery 22 is physically and electrically coupled to printed circuit board 18 by electrical contacts 28 and 30.

Printed circuit board 18 is configured with a beveled edge corner 32 to permit the quick and reliable alignment of power section 16 with frame 14. Printed circuit board 18 is also configured with notches 34 and 36, such that clips 54 and 56 are not impeded by power section 16 during the assembly of power module 10 (See FIGS. 4 and 5).

Figure 2:
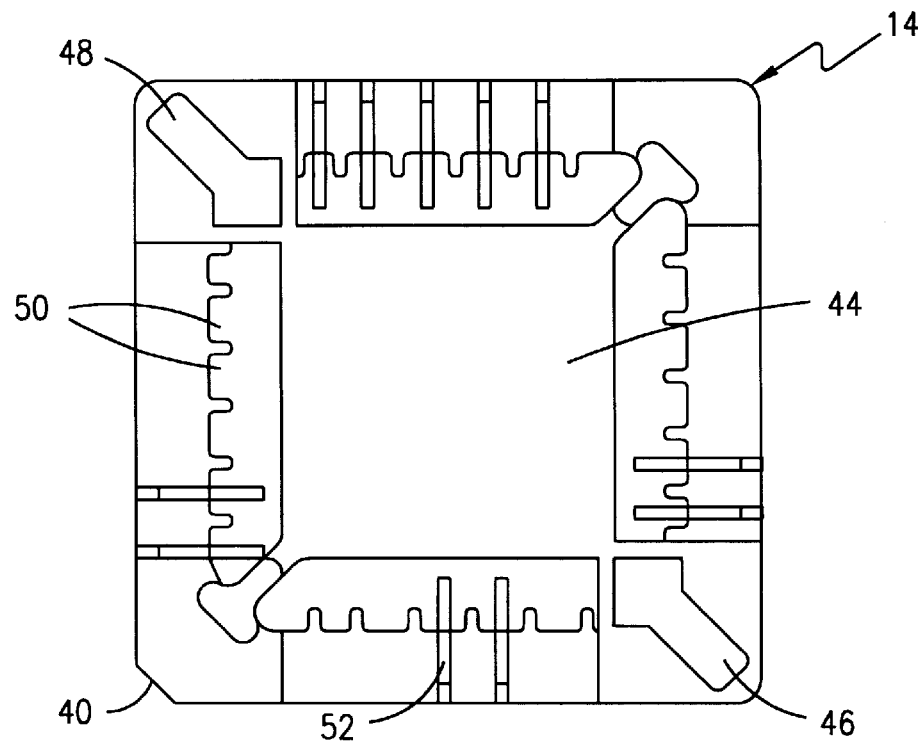
FIG. 2 is a top plan view of the frame of an embodiment of the present invention.
Figure 3:
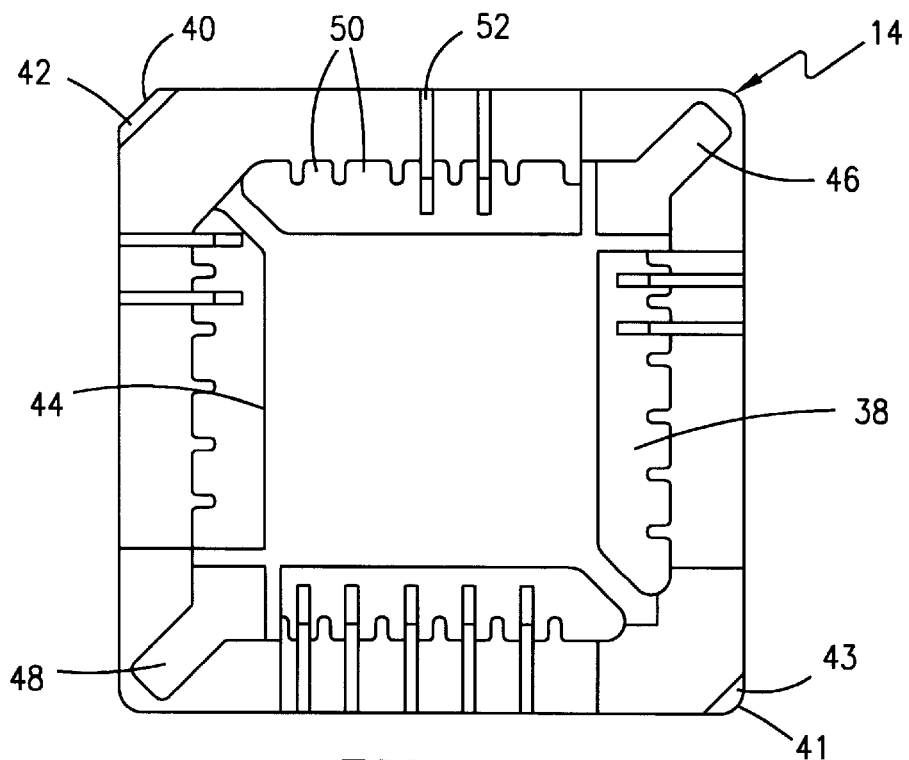
FIG. 3 is a bottom plan view of the frame of an embodiment of the present invention.

Referring now to FIGS. 1–3, it is shown that frame 14 is configured to fit over and make electrical contact with integrated circuit C.

In this embodiment, frame 14 is generally rectangular in shape with an opening 38 also being generally rectangular in shape, for receiving and making electrical contact with integrated circuit C. Although frame 14 and opening 14 are shown to be generally rectangular in shape, it is contemplated to be within the scope of this invention to vary the size and shape of frame 14 and opening 38 to accommodate for integrated circuits of varying sizes and shapes.

Frame 14 includes notches 42 and 43 and a beveled edged corner 40. Notch 42 is located at the bottom of corner 40 and notch 43 is located at the bottom of corner 41. During the assembly of module 10, beveled edged corner 40 is aligned with beveled edge 32 of power section 16 which ensures the proper alignment of power section 16 with frame 14. Likewise during assembly, when cover 12 is properly aligned with frame 14, notches 42 and 43 receive clips 58 and 59, respectively, of cover 12, keeping cover 12 securely positioned over frame 14 and power section 16.

Frame 14 also includes a top portion 44 for receiving the printed circuit board 18 of power section 16, and is further configured with holes 46 and 48 such that clips 54 and 56 can readily pass though frame 14 during the assembly of power module 10 and the placement of power module 10 on integrated circuit C.

Frame 14 further includes multiple slots 50 along the inside perimeter of opening 38. Slots 50 are each configured to receive an electrical contact such as contact 52. Depending on the requirements of the integrated circuit, the total number of electrical contacts utilized can vary.

Good results have been achieved by configuring the electrical contacts of frame 14 with a portion extending parallel with top 44. This permits easy electrical connection between the electrical contacts and printed circuit board 18. The electrical contacts are also configured to extend along slots 50 on the inside perimeter of opening 38. This ensures a good electrical connection between the electrical contacts of frame 14 and the corresponding leads of integrated circuit C.

Good results have also been achieved by extending at least a portion of the electrical contact 52 into opening 38, creating a pressure or spring contact (See FIG. 3). This further ensures and maintains a good electrical contact with the leads of the integrated circuit.

Figure 4:
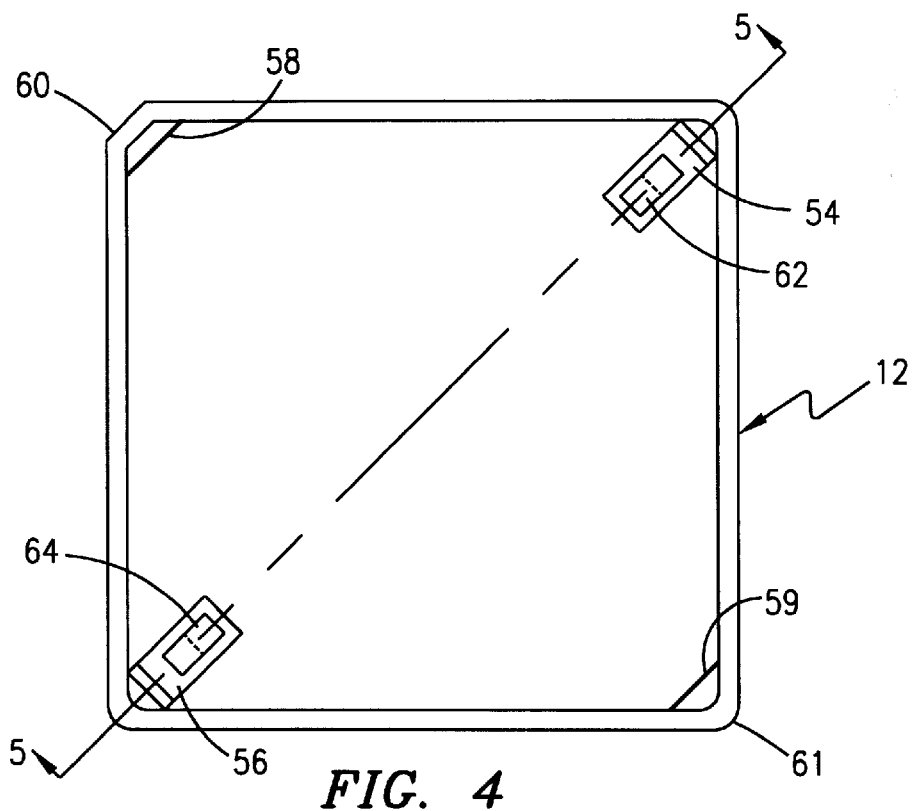
FIG. 4 is a bottom plan view of the cover of an embodiment of the present invention.
Figure 5:
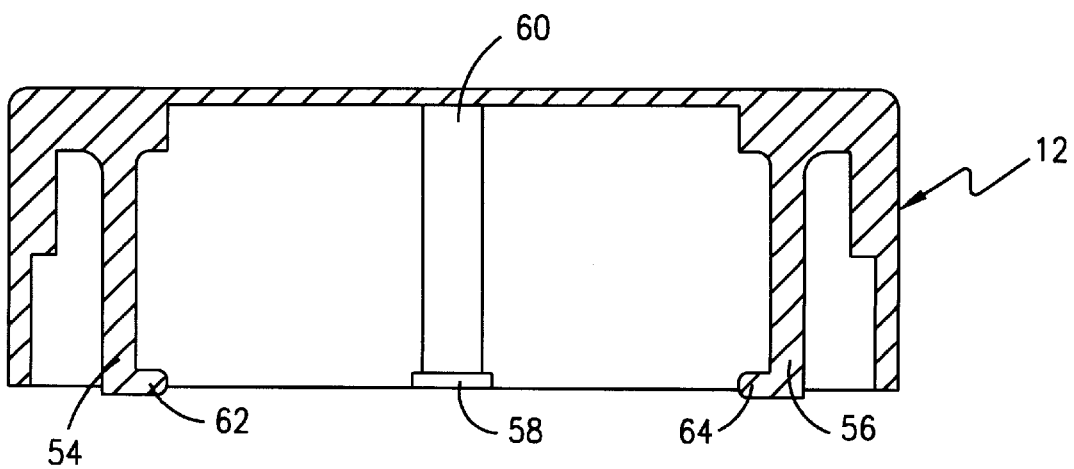
FIG. 5 is a sectional view taken along line 5—5 of FIG. 4.

Referring now to FIGS. 4 and 5, FIG. 4 shows a bottom view of cover 12 and FIG. 5 shows a sectional view of cover 12 taken along line 5—5. Cover 12 includes clips 54, 56, 58 and 59. Clips 54 and 56 extend down from the inside top of cover 12, clip 58 extends inward from beveled edge 60, and clip 59 extends inward from corner 61.

Clips 54 and 56 include flanges 62 and 64 respectively which extend under the integrated circuit C when power module 10 is properly positioned over the integrated circuit C. Flanges 62 and 64 when snapped into place removably secure power module 10 to integrated circuit C.

Although good results have been achieved in utilizing clips 54 and 56 which extend down from the inside top of cover 12 to removably secure power module 10 to integrated circuit C, it is contemplated to be within the scope of this invention that power module 10 can also be configured with clips extending from other parts of the module such as frame 14, so long as the clips can removably secure module 10 to the integrated circuit.

Clips 58 and 59 are inserted into notches 42 and 43 of frame 14, respectively, ensuring proper alignment of cover 12 with frame 14 as well as removably securing cover 12 onto frame 14.

In a preferred method of assembly of power module 10, battery 22 and crystal oscillator 20 are electrically coupled to their proper electrical contacts 28 and 30, and 24 and 26 respectively and are physically secured to printed circuit board 18. Edge 32 of printed circuit board 18 is then aligned with edge 40 of frame 14. Printed circuit board 18 is then placed onto top 44 of frame 14. Electrical contacts 24, 26, 28 and 30 of printed circuit board are then electrically coupled to the appropriate electrical contacts of frame 14.

Beveled edge 60 of cover 12 is aligned with beveled edge 40 of frame 14, and is placed over printed circuit board 18 and frame 14. Clips 58 and 59 are inserted into notches 42 and 43 respectively securing top 12 onto frame 14, with clips 54 and 56 extending into and through holes 46 and 48.

After integrated circuit C has been surface mounted, assembled power module 10 is then placed over integrated circuit C such that flanges 62 and 64 of clips 54 and 56 respectively snap under integrated circuit C thereby removably securing power module 10 to integrated circuit C.

Although clips 54 and 56 are used to secure power module 10 to integrated circuit C, good results have also been achieved by only using pressure contacts within opening 38 to removably secure power module 10 to integrated circuit C as well as to maintain the electrical contact between frame 14 and integrated circuit C.

It is further contemplated to be within the scope of this invention to vary the positioning of battery 22 and crystal oscillator 20 to accommodate varying configurations and varying sizes of integrated circuit.

It is also contemplated to be within the scope of this invention that battery 22 and crystal oscillator 20 can be mounted in various manners which include but is not limited to mounting the battery and crystal directly onto frame 14 without a printed circuit board 18, or directly mounting the battery and crystal within cover 12.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A power module, comprising:
   a. means for providing power to an integrated circuit;
   b. means for providing electrical connection between said means for providing power and the integrated circuit; and
   c. means for removably attaching said means for providing electrical connection to the integrated circuit.

2. A device as recited in claim 1, wherein said means for providing power, includes:
   a. a battery electrically coupled to said means for providing electrical connection.

3. A device as recited in claim 2, further comprising:
   a. a crystal oscillator electrically coupled to said means for providing electrical connection.

4. A device as recited in claim 3, wherein:
   a. said battery and said crystal oscillator are disposed on a printed circuit board;
   b. said printed circuit board having a plurality of electrical contacts;
   c. each of said battery and said crystal oscillator electrically coupled to at least one of said plurality of electrical contacts.

5. A device as recited in claim 4, wherein said means for providing electrical connection includes:
   a. a frame having an opening for receiving the integrated circuit; and
   b. said frame including a plurality of electrical contacts with at least one of said plurality of electrical contacts of said frame electrically coupled to said means for providing power.

6. A device as recited in claim 5, wherein:
   a. said at least one of said plurality of electrical contacts of said frame are electrically coupled to said at least one of said plurality of electrical contacts of said printed circuit board.

7. A device as recited in claim 5, wherein said means for removably attaching includes:
   a. at least one pressure contact disposed within said opening of said frame, wherein said at least one pressure contact maintains contact with the integrated circuit for removably attaching said frame to the integrated circuit.

8. A device as recited in claim 5, wherein said means for removably attaching includes:
   a. at least one clip extending from said power module with at least a portion of said at least one clip extending below the integrated circuit.

9. A device as recited in claim 8, further comprising:
   a. a cover removably attached to said means for providing electrical connection.

10. A device as recited in claim 9, wherein:
    a. said means for providing power positioned intermediate said cover and said means for providing electrical connection.

11. A device as recited in claim 9, wherein:
    a. said at least one clip extends from said cover.

12. A replaceable power module, comprising:
    a. a power unit for providing power to an integrated circuit;
    b. a frame electrically connected to said power unit to provide an electrical connection between said power unit and the integrated circuit; and
    c. an attachment device for removably attaching said frame to the integrated circuit.

13. A device as recited in claim 12, wherein:
    a. said frame includes a plurality of electrical contacts and an opening;
    b. wherein said opening receives the integrated circuit when said replaceable power module is placed over the integrated circuit and said at least one of said plurality of electrical contacts of said frame is electrically coupled to said power unit.

14. A device as recited in claim 12, wherein:
    a. said power unit includes a battery and a crystal oscillator.

15. A device as recited in claim 12, further comprising:
    a. a cover removably attached to said frame with said power unit positioned intermediate said cover and said frame.

16. A device as recited in claim 15, wherein:
    a. said attachment device includes at least one clip extending from said cover, with at least of portion of said at least on clip extending below the integrated circuit.

17. A device as recited in claim 15, wherein:
    a. said attachment device includes at least one pressure contact disposed within said opening of said frame.

18. A replaceable power module, comprising:
    a. a frame including a plurality of electrical contacts and an opening for receiving an integrated circuit therein;
    b. a mount including a plurality of electrical contacts disposed on said frame with at least one of said plurality of electrical contacts of said mount in electrical contact with at least one of said plurality of electrical contacts of said frame;
    c. a battery and an oscillator disposed on said mount, each of said battery and said oscillator electrically coupled to at least one of said plurality of electrical contacts of said mount; and
    d. a cover removably attached to said frame, with said mount positioned intermediate said cover and said frame;
    e. wherein said opening of said frame is removably placed over the integrated circuit with at least on of said plurality of electrical contacts of said frame in electrical contact with the integrated circuit.

19. A device as recited in claim 18, further comprising:
    a. at least one clip extending from said cover with at least a portion of said at least one clip extending below the integrated circuit.

20. A device as recited in claim 18, wherein:
    a. said frame includes at least one pressure contact, wherein said at least one pressure contact maintains contact with the integrated circuit.

* * * * *